(12) United States Patent
Xue

(10) Patent No.: US 11,189,217 B2
(45) Date of Patent: Nov. 30, 2021

(54) SHIFT REGISTER UNIT, GATE DRIVING CIRCUIT AND DISPLAY PANEL

(71) Applicant: Shenzhen China Star Optoelectronics Semiconductor Display Technology Co., Ltd., Guangdong (CN)

(72) Inventor: Yan Xue, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 16/762,932

(22) PCT Filed: Apr. 7, 2020

(86) PCT No.: PCT/CN2020/083596
§ 371 (c)(1),
(2) Date: May 10, 2020

(65) Prior Publication Data
US 2021/0287598 A1   Sep. 16, 2021

(51) Int. Cl.
*G09G 3/32*   (2016.01)

(52) U.S. Cl.
CPC ....... *G09G 3/32* (2013.01); *G09G 2300/0852* (2013.01); *G09G 2310/0286* (2013.01); *G09G 2310/066* (2013.01); *G09G 2330/04* (2013.01)

(58) Field of Classification Search
CPC ............. G09G 3/32; G09G 2300/0852; G09G 2310/0286; G09G 2310/066; G09G 2330/04
See application file for complete search history.

(56) References Cited

U.S. PATENT DOCUMENTS

2021/0082328 A1*   3/2021   Feng .................... G09G 3/3677

\* cited by examiner

*Primary Examiner* — Kenneth B Lee, Jr.
(74) *Attorney, Agent, or Firm* — Mark M. Friedman

(57) ABSTRACT

The present invention provides a shift register unit, a gate driving circuit and a display panel. The shift register unit includes a compensation module connected to a second node, a current-stage transmission signal output end and a second clock signal; a pull-down module connected to a first node, the second node, a (n+2)th-stage transmission signal output end, the current-stage transmission signal output end, a current-stage scan signal output end and a first direct-current low voltage.

18 Claims, 3 Drawing Sheets

SHIFT REGISTER UNIT, GATE DRIVING CIRCUIT AND DISPLAY PANEL

FIELD OF THE DISCLOSURE

The present invention relates to display technologies, and more particularly to a shift register unit, a gate driving circuit and a display panel.

DESCRIPTION OF RELATED ARTS

Currently, driving signals of scan lines of a display panel is provided by a gate driving circuit, which includes a plurality of cascaded shift register units.

The shift register unit includes a pull-down module. The function of the pull-down module is to make the voltages of a point Q, a stage transmission signal output end, a scan signal output end maintain at low potential. The pull-down module includes a metal oxide thin-film transistor.

Technical Problems

However, when the metal oxide thin-film transistor is under pressure, the threshold voltage Vth is easy to drift. When the metal oxide thin-film transistor is subjected to a positive pressure, the threshold voltage will be positively shifted. Once the threshold voltage is positively shifted, ability of the pull-down module to maintain the point Q, the stage transmission signal output end and the scan signal output end at low voltage levels is reduced, resulting in fluctuation on the voltage of the point Q, thereby invalidating a cascaded transmission function of the shift register unit.

Therefore, there is a need to provide a shift register unit, a gate driving circuit and a display panel for solving the problems in the existing art.

Technical Solutions

The objective of the present invention is to provide a shift register unit, a gate driving circuit and a display panel, which can avoid fluctuation on the voltage of point Q and prevent from invalidation of cascaded transmission function.

To solve above technical problems, the present invention provides a shift register unit, including:

a pull-up control module, connected to a (n−1)th-stage transmission signal output end, a first node and a third clock signal, wherein n is greater than or equal to 2;

a down transmission module, connected to a first clock signal, the first node and a current-stage transmission signal output end;

a pull-up module, connected to the first clock signal, the first node and a current-stage scan signal output end;

a pull-down control module, connected to a second node, the first clock signal and the third clock signal;

a compensation module, connected to the second node, the current-stage transmission signal output end and a second clock signal;

a pull-down module, connected to the first node, the second node, a (n+2)th-stage transmission signal output end, the current-stage transmission signal output end, the current-stage scan signal output end and a first direct-current low voltage; and a bootstrap capacitor, one end of which is connected to the first node and the other end of which is connected to the current-stage transmission signal output end.

The present invention further provides a gate driving circuit including a plurality of cascaded shift register units according to above description.

The present invention further provides a display panel including the afore-described gate driving circuit.

Beneficial Effects

In the shift register unit, the gate driving circuit and the display panel of the present invention, by improving the existing shift register unit, the affection of the threshold voltage on the ability to maintain pulling down the voltages can be avoided, thereby avoiding fluctuation on the voltage of point Q and preventing from invalidation of cascaded transmission function. In addition, stability of the shift register unit is improved.

DESCRIPTION OF EMBODIMENTS OF THE DISCLOSURE

The following descriptions for the respective embodiments are specific embodiments capable of being implemented for illustration of the present invention with referring to the appended figures. In describing the present invention, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present invention for ease of understanding, but are not intended to limit the present invention. In the appended figures, units with similar structures are indicated by same reference numbers.

The terms "first" and "second" in the specification, claims and figures of the present application are used to distinguish different objects, rather than used to describe a specific order. In addition, the terms "comprise" and "have" and their arbitrary variants are intended to include non-exclusive inclusion.

Figure 1:
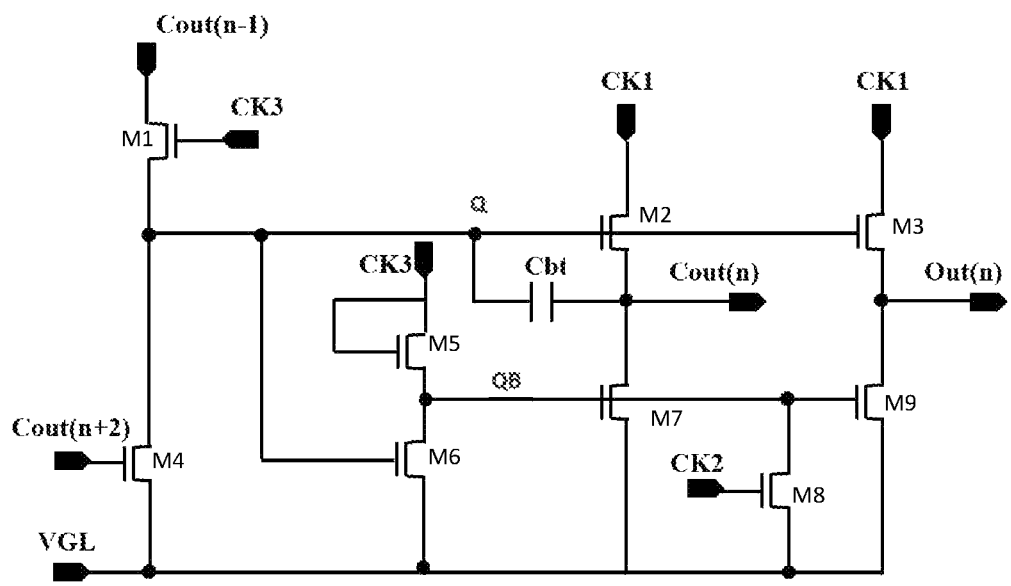
FIG. 1 is a structural schematic diagram illustrating an existing shift register unit.

As shown in FIG. 1, an existing shift register unit includes a first transistor M1 to a ninth transistor M9, and a bootstrap capacitor Cbt.

A source of the first transistor M1 is connected to the (n−1)th-stage transmission signal output end, a gate of the first transistor M1 is connected to a third clock signal CK3, a drain of the first transistor M1 is connected to the first node Q. The (n−1)th-stage transmission signal output end is configured to output a (n−1)th-stage transmission signal Cout(n−1), where n is greater than or equal to 2.

A gate of the second transistor M2 is connected to the first node Q, a source of the second transistor M2 is connected to the first clock signal CK1, a drain of the second transistor M2 is connected to a current-stage transmission signal output end. The current-stage transmission signal output end is configured to output a current-stage transmission signal Cout(n).

A gate of the third transistor M3 is connected to the first node Q, a source of the third transistor M3 is connected to the first clock signal CK1, a drain of the third transistor M3 is connected to a current-stage scan signal output end. The current-stage scan signal output end is configured to output a current-stage scan signal Out(n).

A drain of the fourth transistor M4 is connected to the first node Q. A source of the fourth transistor M4 is connected to the first direct-current low voltage VGL, a gate of the fourth transistor M4 is connected to a (n+2)th-stage transmission signal output end. The (n+2)th-stage transmission signal output end is configured to output a (n+2)th-stage transmission signal Cout(n+2).

Both of a source and a gate of the fifth transistor M5 is connected to the third clock signal CK3, a drain of the fifth transistor M5 is connected to the second node QB.

A source of the sixth transistor M6 is connected to the first direct-current low voltage VGL, a drain of the sixth transistor M6 is connected to the second node QB, a gate of the sixth transistor M6 is connected to the first node Q.

A gate of the seventh transistor M7 is connected to the second node QB, a drain of the seventh transistor M7 is connected to the current-stage transmission signal output end, a source of the seventh transistor M7 is connected to the first direct-current low voltage VGL.

A gate of the eighth transistor M8 is connected to a second clock signal CK2, a drain of the eighth transistor M8 is connected to the second node QB, a source of the eighth transistor M8 is connected to the first direct-current low voltage.

A gate of the ninth transistor M9 is connected to the second node QB, a drain of the ninth transistor M9 is connected to the current-stage scan signal output end, a source of the ninth transistor M9 is connected to the first direct-current low voltage VGL.

One end of the bootstrap capacitor Cbt is connected to the first node Q and the other end of the bootstrap capacitor Cbt is connected to the current-stage transmission signal output end.

The pull-down module includes the seventh transistor M7 and the ninth transistor M9. The ability of each of M7 and M9 to maintain pulling down the voltages is represented by:

Vgs−Vth=Vg−VGL−Vth, where Vg is the potential of point QB.

Figure 2:
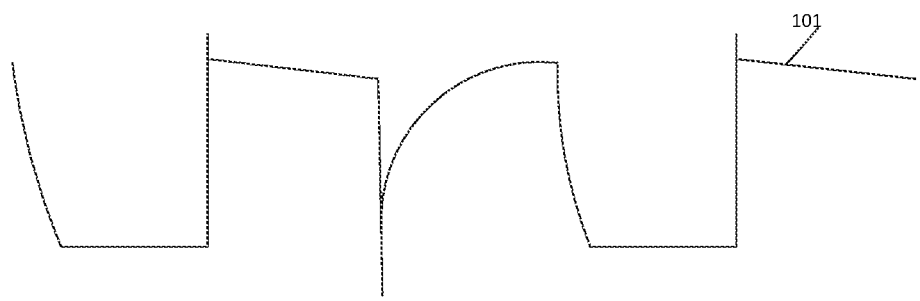
FIG. 2 is a diagram illustrating waveforms at a second node when a threshold voltage of a transistor in a pull-down module shown in FIG. 1 appears to have a positive shift and have no shift.

As shown in FIG. 2, the reference number 101 indicates a waveform at point QB when the threshold voltage of M7 or M9 appears to have a positive shift or have no shift. That is, when the threshold voltage Vth of M7 or M9 is shifted, the potential of point QB maintains unchanged (waveforms of point QB for the positive shift and no shift are overlapped). Accordingly, after the TFT threshold voltage is positively shifted, the difference Vgs−Vth decreases, that is, ability of the pull-down module to maintain pulling down the voltages is reduced.

Figure 3:
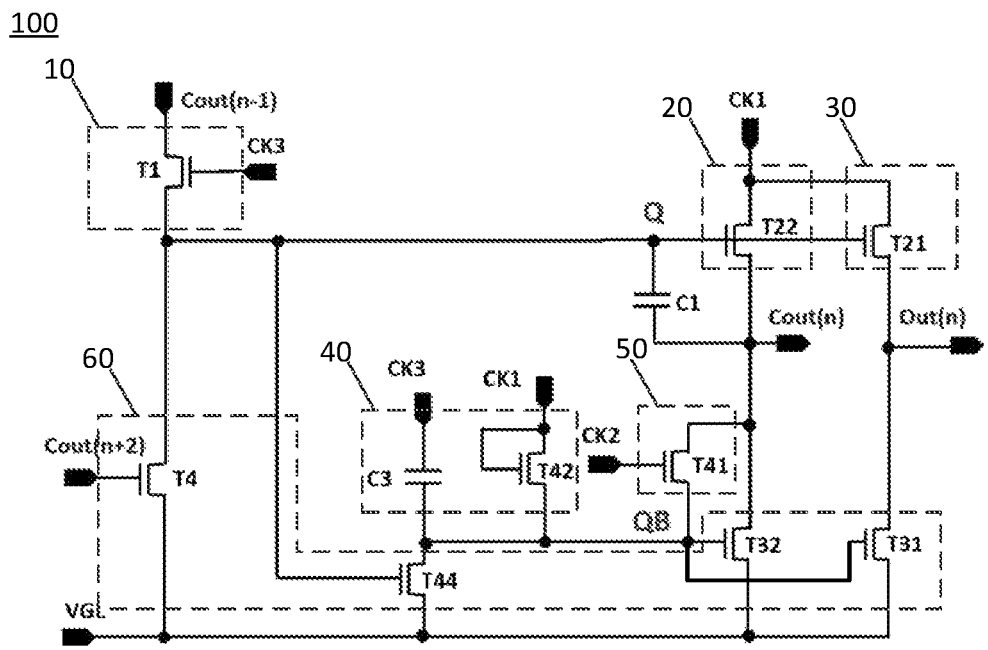
FIG. 3 is a structural schematic diagram illustrating a shift register unit according to an embodiment of the present invention.
Figure 4:
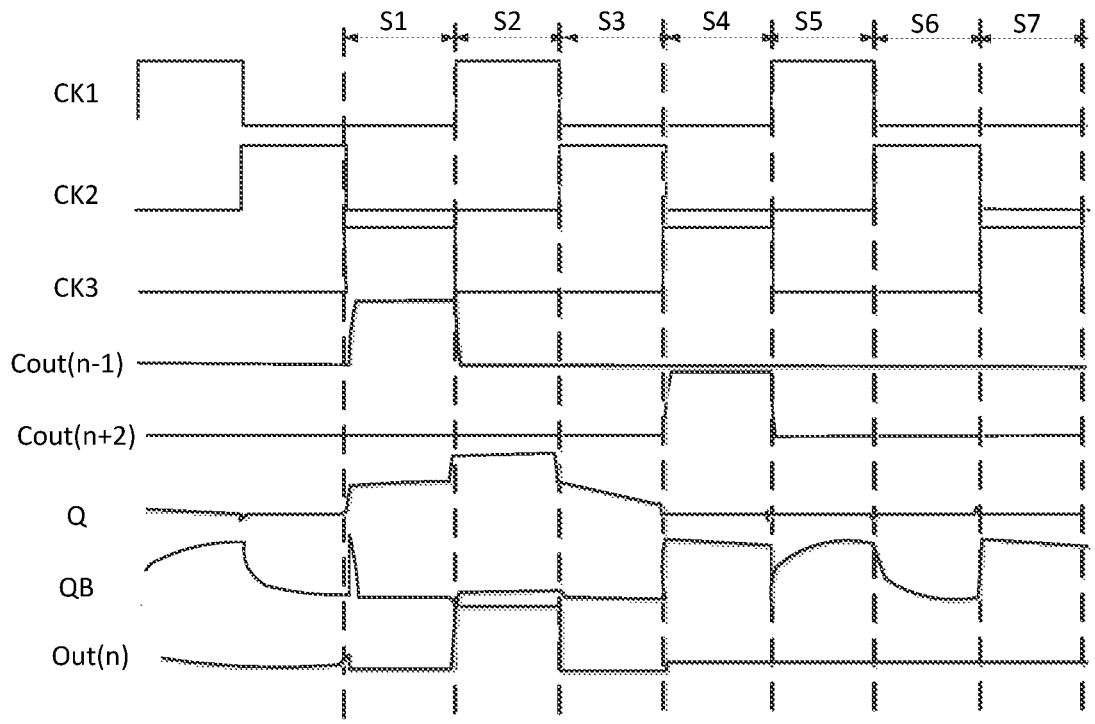
FIG. 4 is a schematic diagram illustrating timing of the shift register unit shown in FIG. 3.
Figure 5:
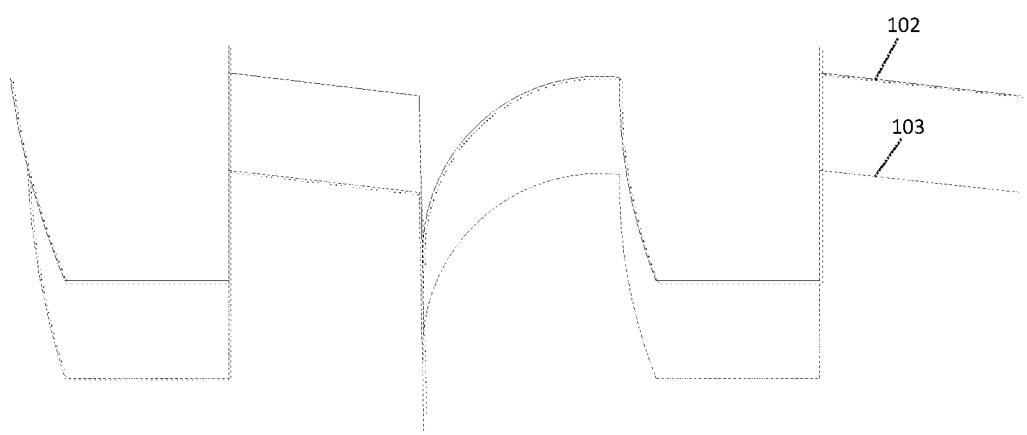
FIG. 5 is a diagram illustrating waveforms at a second node when a threshold voltage of a transistor in a pull-down module shown in FIG. 3 appears to have a positive shift and have no shift.

Please refer to FIGS. 3 to 5. FIG. 3 is a structural schematic diagram illustrating a shift register unit according to an embodiment of the present invention.

As shown in FIG. 3, a shift register unit 100 of the present embodiment includes a pull-up control module 10, a down transmission module 20, a pull-up module 30, a pull-down control module 40, a compensation module 50, a pull-down module 60 and a bootstrap capacitor C1.

The pull-up control module 10 is connected to a (n−1)th-stage transmission signal output end, a first node Q and a third clock signal CK3, wherein n is greater than or equal to 2; The (n−1)th-stage transmission signal output end is configured to output a (n−1)th-stage transmission signal Cout (n−1), The pull-up control module 10 is configured to pull up the potential of the first node Q.

The down transmission module 20 is connected to a first clock signal CK1, the first node Q and a current-stage transmission signal output end. The current-stage transmission signal output end is configured to output a current-stage transmission signal Cout(n).

The pull-up module 30 is connected to the first clock signal CK1, the first node Q and a current-stage scan signal output end. The current-stage scan signal output end is configured to output a current-stage scan signal Out(n).

The pull-down control module 40 is connected to a second node QB, the first clock signal CK1 and the third clock signal CK3.

The compensation module 50 is connected to the second node QB, the current-stage transmission signal output end and a second clock signal CK2.

The pull-down module 60 is connected to the first node Q, the second node QB, a (n+2)th-stage transmission signal output end, the current-stage transmission signal output end, the current-stage scan signal output end and a first direct-current low voltage. The (n+2)th-stage transmission signal output end is configured to output a (n+2)th-stage transmission signal Cout(n+2).

One end of the bootstrap capacitor C1 is connected to the first node Q and the other end of the bootstrap capacitor C1 is connected to the current-stage transmission signal output end.

In an embodiment, the compensation module 50 includes a first transistor T41, a gate of the first transistor T41 is connected to the second clock signal CK2, a source of the first transistor T41 is connected to the current-stage transmission signal output end, a drain of the first transistor T41 is connected to the second node QB.

The pull-down control module 40 includes a second transistor T42, a gate and a source of the second transistor T42 is connected to the first clock signal CK1, a drain of the second transistor T42 is connected to the second node QB.

The pull-down control module 50 may further include a first capacitor C3;

One end of the first capacitor C3 is connected to the second node QB and the other end of the first capacitor C3 is connected to the third clock signal CK3.

The pull-down module 60 includes a third transistor T32, a fourth transistor T31, a fifth transistor T4 and a sixth transistor T44.

A gate of the third transistor T32 is connected to the second node QB, a source of the third transistor T32 is connected to the first direct-current low voltage VGL, a drain of the third transistor T32 is connected to the current-stage transmission signal output end;

A gate of the fourth transistor T31 is connected to the second node QB, a source of the fourth transistor T31 is connected to the first direct-current low voltage VGL, a drain of the fourth transistor is connected to the current-stage scan signal output end;

A gate of the fifth transistor T4 is connected to the (n+2)th-stage transmission signal output end, a source of the fifth transistor T4 is connected to the first direct-current low voltage VGL, a drain of the fifth transistor T4 is connected to the first node Q;

A gate of the sixth transistor T44 is connected to the first node Q, a source of the sixth transistor T44 is connected to the first direct-current low voltage VGL, a drain of the sixth transistor T44 is connected to the second node QB.

The pull-up control module 10 includes a seventh transistor T1, a gate of the seventh transistor T1 is connected to a third clock signal CK3, a source of the seventh transistor T1 is connected to the (n−1)th-stage transmission signal output end, a drain of the seventh transistor T1 is connected to the first node Q.

The pull-up module 30 includes a ninth transistor T21, a gate of the ninth transistor T21 is connected to the first node Q, a source of the ninth transistor T21 is connected to the first clock signal CK1, a drain of the ninth transistor T21 is connected to the current-stage scan signal output end.

The down transmission module 20 includes a tenth transistor T22, a gate of the tenth transistor T22 is connected to the first node Q, a source of the tenth transistor T22 is connected to the first clock signal CK1, a drain of the tenth transistor T22 is connected to the current-stage transmission signal output end.

The first transistor T1 to the tenth transistor T22 can be P-type metal oxide thin-film transistors or N-type metal oxide thin-film transistors.

Signal sources inputted to the shift register unit 100 of the present invention includes Cout(n+2), Cout(n−1), and CK1 to CK3. A minimum of these signals is −10V and a maximum of these signals is 24V. The number of clock signals is 4. The clock cycle is 60 us. The duty ratio is 25%. The number of start signals is one.

The present invention further provides a method for driving a shift register unit. The method is used to drive the afore-described shift register unit. The method includes:

S101—first stage, used to pull up the potential of the first node Q and reset the current-stage scan signal output end and the current-stage transmission signal output end;

S102—second stage, used to pull up the potential of the current-stage scan signal output end and the potential of the current-stage transmission signal output end, and rise again the potential of the first node Q;

S103—third stage, used to pull down the potential of the current-stage scan signal output end, the potential of the current-stage transmission signal output end and the potential of the first node Q;

S104—fourth stage, used to pull up the potential of the second node QB;

S105—fifth stage, used to maintain the potential of the second node QB;

S106—sixth stage, used to write a predetermined threshold voltage to the second node QB; the predetermined threshold voltage is the threshold voltage of T32;

S107—seventh stage, used to increase the potential of the second node QB.

In an embodiment, with reference to FIG. 4 also, the method for driving the shift register unit specifically performs processes as follows, taking N-type metal oxide thin-film transistors for the first transistor T1 to the tenth transistor T10 for example.

First Stage (stage S1): CK3 is high potential, Cout(n−1) is high potential, T1 is turned on, point Q is charged with electricity to high potential, T21, T22 and T44 are turned on. Point QB is at low potential and T31 and T32 is turned off for that T44 is turned on. T21 and T22 are turned on. Since CK1 is low potential, the current-stage transmission signal Cout(n) and the current-stage scan signal Out (n) are low potential.

Second Stage (stage S2): CK3 is changed to low potential, T1 is turned off, CK1 is changed from low potential to high potential. Accordingly, the current-stage transmission signal Count(n) and the current-stage scan signal Out(n) are high potential. Since the presence of the bootstrap capacitor, Point Q is coupled to higher potential.

Third Stage (stage S3): CK1 is lowered from high potential to low potential, the current-stage transmission signal Count(n) and the current-stage scan signal Out(n) are low potential, the potential of point Q is coupled to lower potential.

Fourth Stage (stage S4): CK3 is risen to high potential, point QB is coupled to high potential since the action of the first capacitor C3, T31 and T32 are turned on, Count(n) and Out(n) are thus pulled down. Count(n+2) is high voltage level, T4 is turned on, the potential of point Q is low voltage level.

Fifth Stage (stage S5): CK1 is risen to high potential, T42 is turned on, point QB continue maintaining at high potential.

Sixth Stage (stage S6): CK2 is risen to high potential, meanwhile CK1 and CK3 are lowered to low potential, T41 is turned on, T32 is turned on, point QB is connected to Count(n), T32 is turned off when the potential of point QB and Cout(n) is lowered to Vth+VGL.

Seventh Stage (stage S7): CK3 is risen from low potential to high potential, the potential of point QB is coupled to high potential, T32 and T31 are turned on, point QB is coupled to high potential, specifically Vth+VGL+VGH−VGL=VGH+Vth.

Meanwhile, ability of each of T31 and T32 to maintain pulling down the voltages is:

$$Vgs-Vth=VGH+Vth-VGL-Vth=VGH-VGL.$$

As can be seen, the ability of T31 and T32 to maintain pulling down the voltages is independent from Vth of T31 and T32. That is, the threshold voltage Vth will not affect the ability to maintain pulling down the voltages.

It can be understood that when the first transistor to the tenth transistor are P-type transistor, its principles is similar to above description.

In the present invention, waveforms at point QB is illustrated in FIG. 5. The reference numbers 102 and 103 indicates waveforms at point QB respectively when the threshold voltage of T31 or T32 appears to have a positive shift and have no shift. Taking a positive shift of 10V for the threshold voltage for example, when Vth is positively shifted by 10V, the potential of point QB is also risen by 10V. The ability of each of T31 and T32 to maintain pulling down the voltages is: Vgs−Vth=Vg+10V−VGL−Vth=Vg−VGL. As can be seen, the ability of the pull-down module to maintain pulling down the voltages is identical to that without a shift of the threshold voltage.

Since addition of the compensation module, the potential of point QB is synchronously changed as the threshold voltage changes. In such a way, the affection of the threshold voltage on the ability to maintain pulling down the voltages is avoided, fluctuation on the voltage of point Q is avoided, invalidation of cascaded transmission function is prevented, thereby improving stability of the shift register unit.

The present invention further provides a gate driving circuit including a plurality of cascaded shift register units 100 according to any of above embodiments.

A (n−1)th-stage transmission signal for a first shift register unit is connected to a start signal STA.

The present invention further provides a display panel including the afore-described gate driving circuit.

In the shift register unit, the gate driving circuit and the display panel of the present invention, by improving the existing shift register unit, the affection of the threshold voltage on the ability to maintain pulling down the voltages can be avoided, fluctuation on the voltage of point Q is avoided, invalidation of cascaded transmission function is prevented, thereby improving stability of the shift register unit.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

The invention claimed is:

1. A shift register unit, comprising:
a pull-up control module, connected to a (n−1)th-stage transmission signal output end, a first node and a third clock signal, wherein n is greater than or equal to 2;
a down transmission module, connected to a first clock signal, the first node and a current-stage transmission signal output end;
a pull-up module, connected to the first clock signal, the first node and a current-stage scan signal output end;
a pull-down control module, connected to a second node, the first clock signal and the third clock signal;
a compensation module, connected to the second node, the current-stage transmission signal output end and a second clock signal;
a pull-down module, connected to the first node, the second node, a (n+2)th-stage transmission signal output end, the current-stage transmission signal output end, the current-stage scan signal output end and a first direct-current low voltage; and
a bootstrap capacitor, one end of which is connected to the first node and the other end of which is connected to the current-stage transmission signal output end,
wherein the pull-down module comprises a third transistor, a fourth transistor, a fifth transistor and a sixth transistor;
a gate of the third transistor is connected to the second node, a source of the third transistor is connected to the first direct-current low voltage, a drain of the third transistor is connected to the current-stage transmission signal output end;
a gate of the fourth transistor is connected to the second node, a source of the fourth transistor is connected to the first direct-current low voltage, a drain of the fourth transistor is connected to the current-stage scan signal output end;
a gate of the fifth transistor is connected to the (n+2)th-stage transmission signal output end, a source of the fifth transistor is connected to the first direct-current low voltage, a drain of the fifth transistor is connected to the first node;
a gate of the sixth transistor is connected to the first node, a source of the sixth transistor is connected to the first direct-current low voltage, a drain of the sixth transistor is connected to the second node.

2. The shift register unit according to claim 1, wherein the compensation module comprises a first transistor, a gate of the first transistor is connected to the second clock signal, a source of the first transistor is connected to the current-stage transmission signal output end, a drain of the first transistor is connected to the second node.

3. The shift register unit according to claim 1, wherein the pull-down control module comprises a second transistor, a gate and a source of the second transistor is connected to the first clock signal, a drain of the second transistor is connected to the second node.

4. The shift register unit according to claim 3, wherein the pull-down control module further comprises a first capacitor; one end of the first capacitor is connected to the second node and the other end of the first capacitor is connected to the third clock signal.

5. The shift register unit according to claim 1, wherein the pull-up control module comprises a seventh transistor, a source of the seventh transistor is connected to the (n−1)th-stage transmission signal output end, a gate of the seventh transistor is connected to the third clock signal, a drain of the seventh transistor is connected to the first node.

6. The shift register unit according to claim 1, wherein the pull-up module comprises a ninth transistor, a gate of the ninth transistor is connected to the first node, a source of the ninth transistor is connected to the first clock signal, a drain of the ninth transistor is connected to the current-stage scan signal output end.

7. The shift register unit according to claim 1, wherein the down transmission module comprises a tenth transistor, a gate of the tenth transistor is connected to the first node, a source of the tenth transistor is connected to the first clock signal, a drain of the tenth transistor is connected to the current-stage transmission signal output end.

8. A gate driving circuit, comprising a shift register unit comprising:
a pull-up control module, connected to a (n−1)th-stage transmission signal output end, a first node and a third clock signal, wherein n is greater than or equal to 2;
a down transmission module, connected to a first clock signal, the first node and a current-stage transmission signal output end;
a pull-up module, connected to the first clock signal, the first node and a current-stage scan signal output end;
a pull-down control module, connected to a second node, the first clock signal and the third clock signal;
a compensation module, connected to the second node, the current-stage transmission signal output end and a second clock signal;
a pull-down module, connected to the first node, the second node, a (n+2)th-stage transmission signal output end, the current-stage transmission signal output end, the current-stage scan signal output end and a first direct-current low voltage; and
a bootstrap capacitor, one end of which is connected to the first node and the other end of which is connected to the current-stage transmission signal output end,
wherein the pull-down module comprises a third transistor, a fourth transistor, a fifth transistor and a sixth transistor;
a gate of the third transistor is connected to the second node, a source of the third transistor is connected to the first direct-current low voltage, a drain of the third transistor is connected to the current-stage transmission signal output end;
a gate of the fourth transistor is connected to the second node, a source of the fourth transistor is connected to the first direct-current low voltage, a drain of the fourth transistor is connected to the current-stage scan signal output end;

a gate of the fifth transistor is connected to the (n+2)th-stage transmission signal output end, a source of the fifth transistor is connected to the first direct-current low voltage, a drain of the fifth transistor is connected to the first node;

a gate of the sixth transistor is connected to the first node, a source of the sixth transistor is connected to the first direct-current low voltage, a drain of the sixth transistor is connected to the second node.

9. The gate driving circuit according to claim 8, wherein the compensation module comprises a first transistor, a gate of the first transistor is connected to the second clock signal, a source of the first transistor is connected to the current-stage transmission signal output end, a drain of the first transistor is connected to the second node.

10. The gate driving circuit according to claim 8, wherein the pull-down control module comprises a second transistor, a gate and a source of the second transistor is connected to the first clock signal, a drain of the second transistor is connected to the second node.

11. The gate driving circuit according to claim 10, wherein the pull-down control module further comprises a first capacitor; one end of the first capacitor is connected to the second node and the other end of the first capacitor is connected to the third clock signal.

12. The gate driving circuit according to claim 8, wherein the pull-up control module comprises a seventh transistor, a source of the seventh transistor is connected to the (n−1)th-stage transmission signal output end, a gate of the seventh transistor is connected to the third clock signal, a drain of the seventh transistor is connected to the first node.

13. The gate driving circuit according to claim 8, wherein the pull-up module comprises a ninth transistor, a gate of the ninth transistor is connected to the first node, a source of the ninth transistor is connected to the first clock signal, a drain of the ninth transistor is connected to the current-stage scan signal output end.

14. The gate driving circuit according to claim 8, wherein the down transmission module comprises a tenth transistor, a gate of the tenth transistor is connected to the first node, a source of the tenth transistor is connected to the first clock signal, a drain of the tenth transistor is connected to the current-stage transmission signal output end.

15. A display panel, comprising a gate driving circuit, which comprises a shift register unit comprising:

a pull-up control module, connected to a (n−1)th-stage transmission signal output end, a first node and a third clock signal, wherein n is greater than or equal to 2;

a down transmission module, connected to a first clock signal, the first node and a current-stage transmission signal output end;

a pull-up module, connected to the first clock signal, the first node and a current-stage scan signal output end;

a pull-down control module, connected to a second node, the first clock signal and the third clock signal;

a compensation module, connected to the second node, the current-stage transmission signal output end and a second clock signal;

a pull-down module, connected to the first node, the second node, a (n+2)th-stage transmission signal output end, the current-stage transmission signal output end, the current-stage scan signal output end and a first direct-current low voltage; and a bootstrap capacitor, one end of which is connected to the first node and the other end of which is connected to the current-stage transmission signal output end, wherein the pull-down module comprises a third transistor, a fourth transistor, a fifth transistor and a sixth transistor;

a gate of the third transistor is connected to the second node, a source of the third transistor is connected to the first direct-current low voltage, a drain of the third transistor is connected to the current-stage transmission signal output end;

a gate of the fourth transistor is connected to the second node, a source of the fourth transistor is connected to the first direct-current low voltage, a drain of the fourth transistor is connected to the current-stage scan signal output end;

a gate of the fifth transistor is connected to the (n+2)th-stage transmission signal output end, a source of the fifth transistor is connected to the first direct-current low voltage, a drain of the fifth transistor is connected to the first node;

a gate of the sixth transistor is connected to the first node, a source of the sixth transistor is connected to the first direct-current low voltage, a drain of the sixth transistor is connected to the second node.

16. The display panel according to claim 15, wherein the compensation module comprises a first transistor, a gate of the first transistor is connected to the second clock signal, a source of the first transistor is connected to the current-stage transmission signal output end, a drain of the first transistor is connected to the second node.

17. The display panel according to claim 15, wherein the pull-down control module comprises a second transistor, a gate and a source of the second transistor is connected to the first clock signal, a drain of the second transistor is connected to the second node.

18. The display panel according to claim 17, wherein the pull-down control module further comprises a first capacitor; one end of the first capacitor is connected to the second node and the other end of the first capacitor is connected to the third clock signal.

* * * * *

UNITED STATES PATENT AND TRADEMARK OFFICE
CERTIFICATE OF CORRECTION

PATENT NO. : 11,189,217 B2
APPLICATION NO. : 16/762932
DATED : November 30, 2021
INVENTOR(S) : Yan Xue It is certified that error appears in the above-identified patent and that said Letters Patent is hereby corrected as shown below:

On the Title Page

Item (30) should be added as follows:
Foreign Application Priority Data
March 12, 2020 (CN).............................. 202010171163.1

Signed and Sealed this
First Day of November, 2022

Katherine Kelly Vidal
*Director of the United States Patent and Trademark Office*